United States Patent [19]

Kurihara et al.

[11] Patent Number: 5,314,726
[45] Date of Patent: May 24, 1994

[54] PROCESS FOR FORMING A MIXED LAYER OF A PLASMA SPRAYED MATERIAL AND DIAMOND

[75] Inventors: Kazuaki Kurihara, Atsugi; Motonobu Kawarada, Sagamihara; Ken-ichi Sasaki, Atsugi; Akitomo Teshima, Isehara, all of Japan

[73] Assignee: Fujitsu Ltd., Kawasaki, Japan

[21] Appl. No.: 767,890

[22] Filed: Sep. 30, 1991

[30] Foreign Application Priority Data

Oct. 17, 1990 [JP] Japan .................. 2-278229

[51] Int. Cl.⁵ .................. B05D 3/06; B05D 1/00
[52] U.S. Cl. .................. 427/577; 427/449; 427/450; 427/572; 427/249; 427/122; 423/446; 428/408
[58] Field of Search .................. 427/34, 38, 39, 423, 427/249, 122, 53.1, 450, 449, 577, 572, 570; 423/446; 156/DIG. 68; 428/408

[56] References Cited

U.S. PATENT DOCUMENTS

| | | | |
|---|---|---|---|
| 4,892,751 | 1/1990 | Miyake et al. | 427/577 |
| 4,928,879 | 5/1990 | Rotolico | 239/8 |
| 4,981,717 | 1/1991 | Thaler | 427/572 |
| 5,047,612 | 9/1991 | Savkar et al. | 219/121.47 |

FOREIGN PATENT DOCUMENTS

| | | |
|---|---|---|
| 0279898 | 8/1988 | European Pat. Off. |
| 0286306 | 10/1988 | European Pat. Off. |
| 0388861 | 9/1990 | European Pat. Off. |
| 64-33096 | 2/1989 | Japan |
| 2-22471 | 1/1990 | Japan |

OTHER PUBLICATIONS

Kurihara et al., "Formation of functionally gradient diamond films", Mater. Sci. Monogr., 73 (Appl. Diamond Films Relat. Mater.), pp. 461–466, 1991.

Kitahama et al., "Synthesis of diamond by laser-induced chemical vapor deposition", Appl. Phys. lett. 49(11) Sep. 1986 pp. 634–635.

Patent Abstracts of Japan, vol. 9, No. 17 (C-262)(1740) Jan. 24, 1985 & JP-A-59 166 673 (Mitsubishi Kinzoku K.K.) Sep. 20, 1984.

Primary Examiner—Roy V. King
Attorney, Agent, or Firm—Staas & Halsey

[57] ABSTRACT

A process for forming a diamond gas phase synthesized coating film which is easily controlled and affords a high quality, good adhesion strength diamond film includes a step of forming a mixed layer of a plasma spraying material and diamond by simultaneously conducting plasma injection by a plasma spraying, a first torch and plasma CVD by a CVD plasma, second torch to thereby form a mixed layer on the substrate. The first and second torches are structurally distinct and have respective, separately and selectively controlled plasma generation operating conditions.

4 Claims, 9 Drawing Sheets

PROCESS FOR FORMING A MIXED LAYER OF A PLASMA SPRAYED MATERIAL AND DIAMOND

BACKGROUND OF THE INVENTION

1. Field of the Invention

The present invention relates to a coating technique, and more specifically, to a coating technique for a gas phase synthesized diamond film.

Diamond is the hardest material in the world, has a Vicker's hardness of 10,000 and a high Young's modulus and heat conductivity, and a superior wear resistance and chemical stability, and these superior properties of diamond lead to hopes for various applications thereof as a bulk material or as a coating material. For example, a diamond film could be applied as a wear resistant coating, as a speaker diaphragm, and as a transparent coating for an optical component.

2. Description of the Related Art

The synthesizing of diamond under high temperatures and high pressures, and recently, by a gas phase chemical reaction process (CVD), has long been studied.

For example, a technique for a chemical vapor deposition of a diamond film by a plasma CVD of $CH_4$ gas diluted with $H_2$ has been proposed. In this process, due to the plasma in the plasma CVD, the $H_2$ is excited and activated H atoms are produced, which remove the amorphous carbon and carbon deposits other than diamond, leaving only the diamond, and thus enable the growth of a diamond CVD film.

Nevertheless, a gas phase synthesized diamond film in general has a very low adhesion strength, and although attempts have been made to increase the nuclei forming density of diamond and provide carbides and other intermediate layers, to thus improve the adhesion strength, good results have not been obtained.

The present inventors further developed the DC plasma jet CVD process for a high speed gas phase synthesis of diamond (see Japanese Unexamined Patent Publication No. 64-33096), and proposed a process for forming a plasma sprayed film including diamond by supplying metal and ceramic powder into the plasma during the synthesis of diamond in the DC plasma jet CVD process (Japanese Unexamined Patent Publication No. 2-22471). In this process, an intermediate layer composed of a plasma spraying material and diamond is formed between the plasma sprayed film and the diamond film, and a high adhesion strength is thus obtained.

FIG. 8 shows an apparatus for the production of a coating film formed of a mixed layer of a plasma spraying material and diamond in accordance with the above process.

The anode 1 surrounds the cathode 2, to thereby form a gas passage 3 for the synthesizing gas, etc. Further, a DC power source 4 is connected between the anode 1 and the cathode 2 and a plasma forming gas, such as a mixed gas of $H_2$ gas and $CH_4$ gas, is supplied to the gas passage 3 for the synthesis of diamond. When a DC voltage is applied across the anode 1 and the cathode 2, to produce a DC discharge, a plasma is formed. In FIG. 8, a nozzle 5 for supplying the powder is formed at the tip of the anode 1, and a carrier gas 6 including the plasma spraying powder is supplied from the nozzle 5. The plasma spraying powder is melted in the plasma, is deposited on the surface of the substrate 7, and is solidified to plasma a flame sprayed film.

When Ar or another inert gas is supplied to the gas passage 3 and plasma spraying powder is supplied from the nozzle 5, it is possible to form a plasma sprayed film on the substrate. If powder is not supplied from the nozzle 5 but a diamond synthesis gas is supplied to the gas passage 3, then it is possible to form a diamond film on the substrate. Further, if a diamond synthesis gas is supplied to the gas passage 3 and plasma spraying powder is supplied to the nozzle 5, then the plasma spraying and synthesis of the diamond gas phase are conducted simultaneously, and thus it is possible to form a mixed film of a plasma spraying material and diamond on the substrate.

For example, first a plasma sprayed film 8 comprised of the same material as the substrate, or a material having a good affinity therewith, is formed on the substrate 7, a mixed film 9 of the plasma spraying material and diamond is formed thereover, and a diamond gas phase synthesized film 10 then formed as a top film thereover.

In such a laminated structure, even if, for example, the substrate 7 and diamond film 10 have vastly different thermal expansion coefficients, a diamond film 10 can be formed on the substrate 7 with a good adhesion strength.

Nevertheless, in the conventional process explained above with reference to FIG. 8, the following problems arise:

(1) It is difficult to separately control the conditions for the plasma spraying and diamond synthesis.
(2) During the formation of the mixed layer, the plasma spraying powder is melted in a plasma mainly composed of hydrogen, and thus is adversely affected by the hydrogen.
(3) Since a DC arc discharge is used, the electrode material becomes mixed in the film.
(4) Since a DC arc discharge is used, the discharge is not stable.
(5) The speed of the formation of the diamond film is relatively slow and it is difficult to supply fine amounts of the plasma spraying powder in accordance with same.

A solution to these problems is required.

SUMMARY OF THE INVENTION

Accordingly, the object of the present invention is to solve at least one of the above problems and to provide an easily controlled technique for the production of a high quality diamond film having a good adhesion strength.

Other objects and advantages of the present invention will be apparent from the following description.

In accordance with the present invention, there is provided a process for the production of a coating film comprising a step of forming a mixed layer of a plasma spraying material and diamond, characterized by including a step of conducting plasma flame spraying by a plasma spraying torch, and simultaneously conducting a plasma CVD by a CVD plasma torch, to thereby form a mixed layer on a substrate.

In accordance with the present invention, there is also provided a process for the production of a coating film comprising a step of forming a mixed layer of a plasma spraying material and diamond, characterized by a step of generating a plasma by a single plasma torch by using either an RF discharge or a laser breakdown discharge and conducting a plasma spraying and plasma CVD to thereby form a mixed layer.

In accordance with the present invention, there is further provided a process for the production of a coating film comprising a step of forming a mixed layer of a plasma spraying material and diamond, characterized by step of conducting a plasma spraying while supplying a plasma spraying material in the form of a wire, to thereby form the mixed layer.

BRIEF DESCRIPTION OF THE DRAWINGS

The present invention will be better understood from the description set forth below with reference to the accompanying drawings, wherein.

DESCRIPTION OF THE PREFERRED EMBODIMENTS

Figure 1:
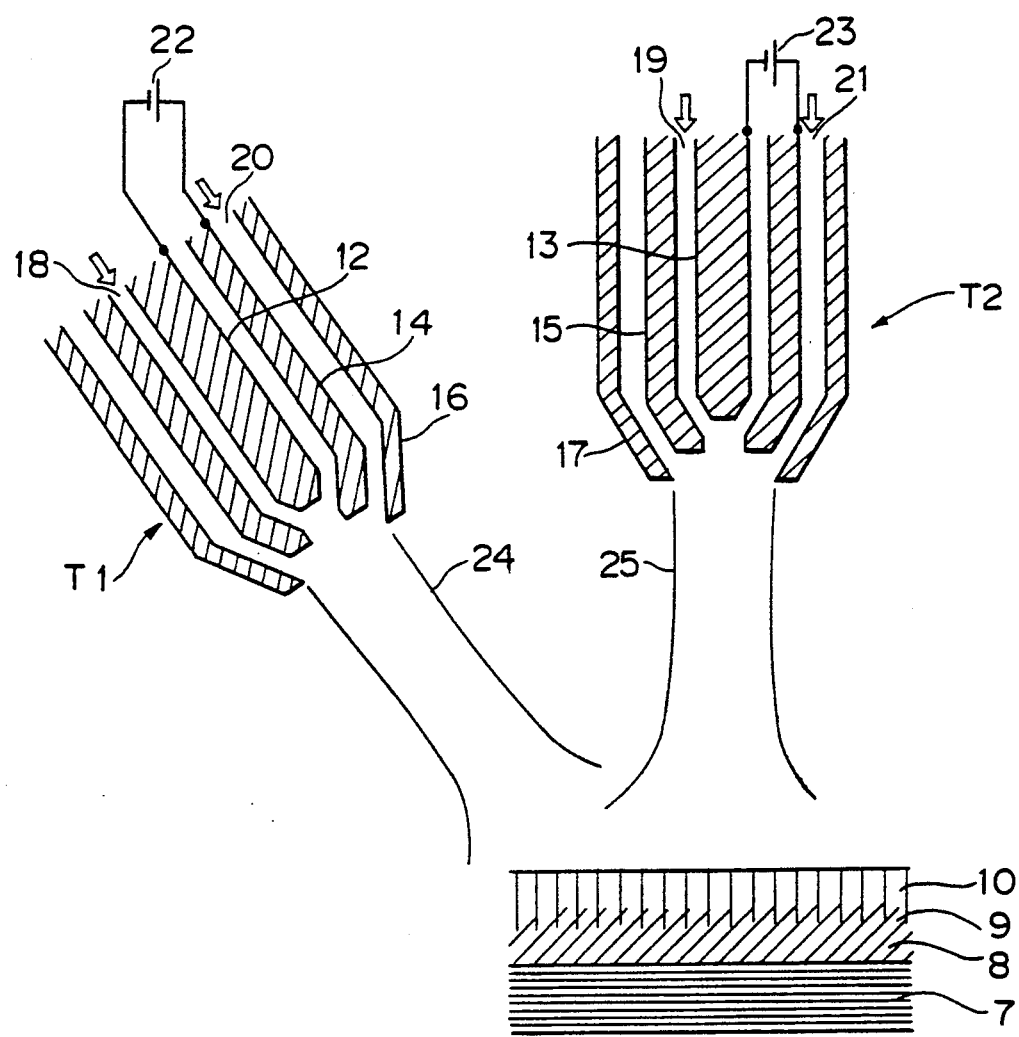
FIG. 1 is a sectional schematic view of a film forming apparatus having two DC plasma torches according to an embodiment of the present invention.

The difficulty of carrying out a separate control of the plasma spraying and diamond synthesis conditions, and the susceptibility of the plasma spraying material to the effects of hydrogen, are due to the use of the diamond synthesis torch for the plasma spraying, under diamond synthesis conditions. These problems are solved by separating the diamond synthesis torch and the plasma spraying torch and conducting the CVD and plasma spraying under appropriate respective conditions.

The problem of an intrusion of the electrode materials into the film arises due to the use of a DC discharge and a consumption of the electrode material. This problem can be solved by generating a high temperature plasma by an RF (Radio high frequency) discharge or laser breakdown discharge, which breaks down the gas with a condensing type large output laser to make a plasma, and other discharge methods not requiring the use of electrodes.

Further, these discharge processes are more stable than a DC discharge, and therefore, the problem of the instability of the discharge also can be solved.

Note that the desired effects can be obtained by the use of these processes for at least one of the plasma spraying and diamond synthesis.

The problem of the difficulty of supplying finely controlled amounts of the plasma spraying material, in accordance with the speed of diamond film formation, arises due to the lack of an apparatus for supplying fine amounts of powder; however by using a wire instead of powder, and making the wire diameter small and slowing the supply speed thereof, it is possible to supply fine amounts of plasma spraying material matching the speed of formation in the diamond gas phase synthesis.

First, the main aspects of the embodiments of the present invention will be shown in the following table:

| Torch | For diamond synthesis | For plasma spraying | Supply of plasma spraying material |
|---|---|---|---|
| Single torch | DC | | Powder |
| Single torch | 1) RF<br>2) Laser breakdown | | 1) Powder<br>2) Wire |
| Separate torches | 1) DC<br>2) Laser breakdown | 1) DC<br>2) RF<br>3) Laser breakdown | 1) Powder<br>2) Wire |

Note that a DC plasma torch has advantages such that it has a simple construction and a relatively low cost, the output thereof can be easily increased, the velocity of the plasma can be made faster, and the torch and substrate can be placed apart from each other.

An RF plasma torch has advantages such that it can prevent an intrusion of impurities and has an excellent discharge stability.

Further, a laser breakdown plasma torch has advantages such that it can prevent an intrusion of impurities, has an excellent discharge stability, and provides an excellent controllability of the film formation.

On the other hand, a DC plasma torch suffers from an intrusion of W and other electrode materials into the film, and does not have a satisfactory discharge stability.

An RF plasma torch has a slow plasma verosity and cannot be placed far apart from the substrate. Also, when the diamond CVD is conducted by an RF plasma torch, it is difficult to conduct the plasma spraying by using a separate torch.

Further, a laser breakdown plasma torch is of a higher cost and it is difficult to increase the output thereof.

These methods can be suitably selected and used in accordance with a specific object.

For example, when using separate torches, a DC plasma or laser breakdown plasma torch can be used for the diamond synthesis torch, any one of a DC plasma, RF plasma, or laser breakdown plasma torch can be used for the plasma spraying torch, and the plasma spraying material can be supplied as a powder or wire, and accordingly, twelve (12) process combinations are possible.

Therefore, as shown in the table, seventeen (17) combinations can be made.

FIG. 1 is a schematic view explaining the formation of a coating film using two torches, according to an embodiment of the present invention.

In a reduced pressure chamber (not shown) connected to an exhaust apparatus, there are arranged two torches T1 and T2. The first torch T1 is used for diamond synthesis and the second torch T2 is used for plasma spraying. These torches have anodes 14 and 15 and cathodes 12 and 13, respectively, and DC power sources 22 and 23 are connected therebetween. Also, gas passages 18 and 19 are formed between the respective anodes 14 and 15 and cathodes 12 and 13. Further, outside members 16 and 17 are arranged so as to surround the anodes 14 and 15, whereby gas passages 20 and 21 are formed. In the first torch T1, separate gas passages are thus defined between the anode 14 and the cathode 12 and between the anode 14 and the outer member 16, to supply, respectively and for example, $H_2$ gas and $CH_4$ gas. Further, in the second torch T2, for example, a plasma forming gas (for example, Ar) flows in the gas passage between the cathode 13 and the anode 15 and a plasma spraying material powder, carried in a carrier gas, flows in the gas passage between the anode 15 and the outside member 17.

In the first torch T1, it is possible to synthesize diamond by applying a DC voltage across the cathode 12 and the anode 14, supplying $H_2$ gas to the inside gas passage 18, and supplying $CH_4$ gas to the outside gas passage 20.

In the second torch T2, it is possible to conduct plasma spraying of the plasma spraying material by supplying Ar gas to the gas passage 19 as the plasma forming gas and supplying a plasma spraying material powder mixed in an Ar carrier gas to the outside gas passage 21. Note, in the figure, 24 and 25 show the formed plasma jets.

When the diamond synthesis torch T1 and the plasma spraying torch T2 are separately controlled, the plasma spraying film 8 is first formed on the substrate 7, then the plasma sprayed/diamond mixed layer 9 is formed, and the diamond film 10 is formed as the top film.

Because an exclusive torch T2 is used for the plasma spraying, the conditions suited for the plasma spraying can be selected separately from those of the diamond synthesis. Further, it is possible to freely select the plasma gas for the plasma spraying, and thus the effects of the hydrogen can be alleviated.

In an apparatus with two DC discharge torches as shown in FIG. 1, a Ti plasma sprayed film and Ti/diamond mixed film were formed on the Ti substrate as intermediate layers, and a diamond film was formed thereon. The substrate 7 was a 20×20×5 mm Ti plate, the temperature of the substrate during film formation was about 900° C., and the pressure was 50 Torr. The Ti plasma spraying conditions were an Ar flow rate of 10 liters/min., an output of 30 kW, an average particle size of the Ti powder of 5 μm, and a plasma spraying speed of 5 to 20 μm/min. The conditions for the diamond synthesis were a flow rate of the hydrogen gas of 50 liters/min., a flow rate of methane gas of 1 liter/min, and an output of 5 kW. The speed of diamond film formation under these conditions was about 1 μm/min. The steps in the film formation were first, establishing a sufficient separation of the substrate from the torches, producing ignition of the two torches, and establishing a stable state. At this time, the supply of the plasma spraying powder was controlled to obtain a plasma spraying speed of 20 μm/min. Next, the substrate was moved to a predetermined position and the film formation was started. After 5 minutes of film formation, the plasma spraying speed was gradually reduced over 5 minutes to 5 μm/min. A plasma spraying speed lower than this is difficult to control, and thus the supply of the plasma spraying powder was turned on and off as a control for reducing the average plasma spraying speed.

Finally, the supply of the plasma spraying powder was stopped and the formation of only a diamond film was conducted for about 100 minutes.

Figure 6:
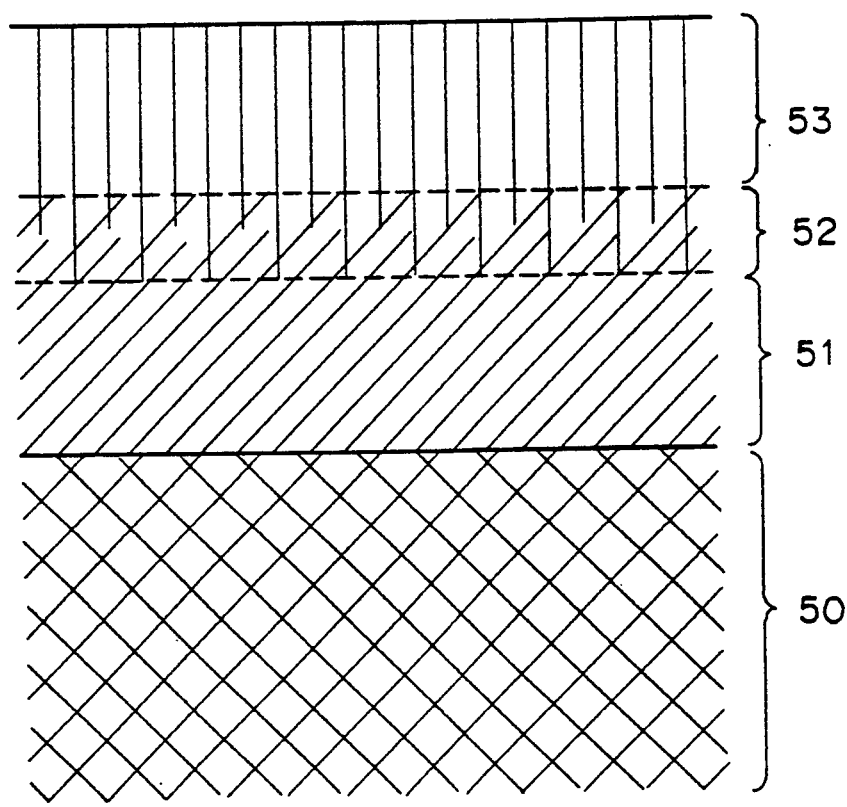
FIG. 6 is a sectional view of an example of the structure of a formed film.

FIG. 6 is a schematic view of the laminated structure formed above.

A plasma sprayed Ti layer 51 is formed on top of the Ti substrate 50, a Ti/diamond gradient composition mixed layer 52 is formed on top of that, and a diamond layer 53 is formed on top of that.

A sample having the structure shown in FIG. 6 was subjected to tests after the formation of the film. The sample section was examined by X-ray diffraction, and further was heated to 500° C. and then cooled with water to give a heat shock thereto. As a result of a micro X-ray diffraction of the section, a slight amount of TiC was detected in addition to the Ti from the plasma sprayed Ti layer 51, and Ti, TiC, and diamond were detected from the mixed layer 52. Further, only diamond was detected from the diamond layer 53. The process produced a vastly superior purity in all of the plasma sprayed layer, mixed layer, and gas phase synthesized layer. Further, the heat shock test was repeated three times, but no peeling or cracking of the film occurred, and accordingly, it was proved that the adhesion strength was excellent.

Figure 8:
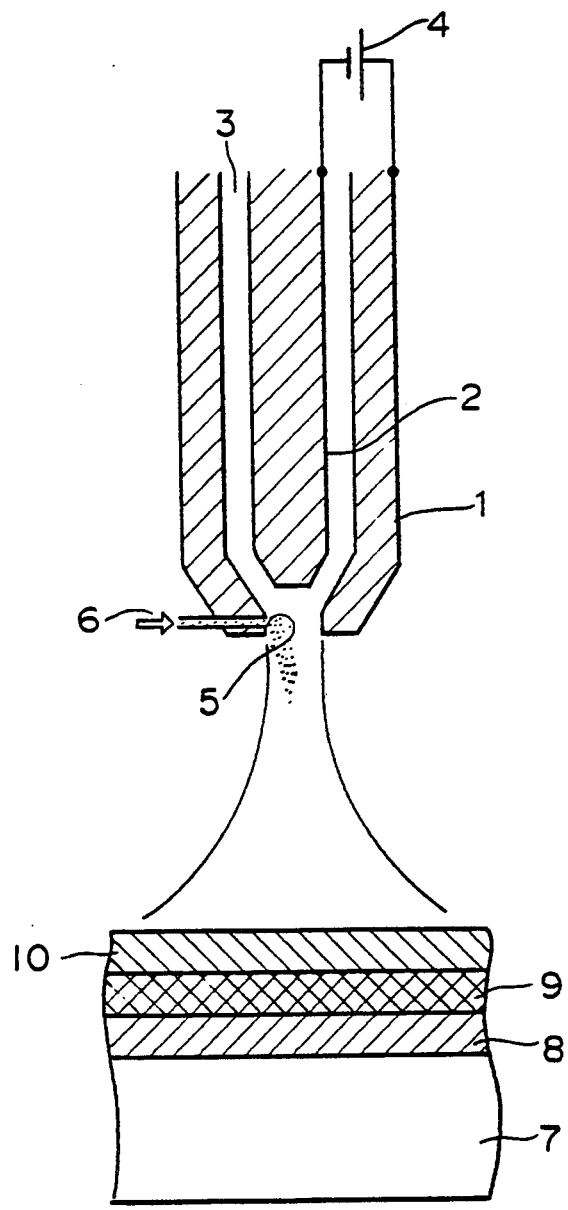
FIG. 8 is a sectional schematic view of the structure of a film forming apparatus according to the prior art.

Note, to compare the formation of the coating film by the embodiment shown in FIG. 1 with the formation of a coating film by the prior art shown in FIG. 8, the production apparatus of FIG. 8 was used to form the same layered structure as in FIG. 6. The same tests as above were performed on a sample formed in this way, i.e., the section was examined by X-ray diffraction and a heat shock test was performed by heating the sample to 500° C. and then cooling it with water.

As a result of a micro X-ray diffraction of the section, only a slight amount of Ti was detected from the Ti layer 51, and almost all of the rest was TiC. Further, in the heat shock test, the diamond film cracked after a single test and a partial peeling also occurred. The peeled sample was investigated, and the peeling was found to have occurred between the Ti substrate 50 and the Ti plasma sprayed film 51.

The reasons for the peeling in the prior art structure are believed to be the change of Ti to TiC due to the supply of Ti powder in the hydrogen/methane plasma, and the differences in the heat expansion coefficients of the Ti substrate 50 and the plasma sprayed layer 51, and the embrittlement due to the absorption of hydrogen, which reduced the toughness of the plasma sprayed layer, etc. Note, the significance of the above-mentioned embodiment is made clear by this comparative test.

Figure 2:
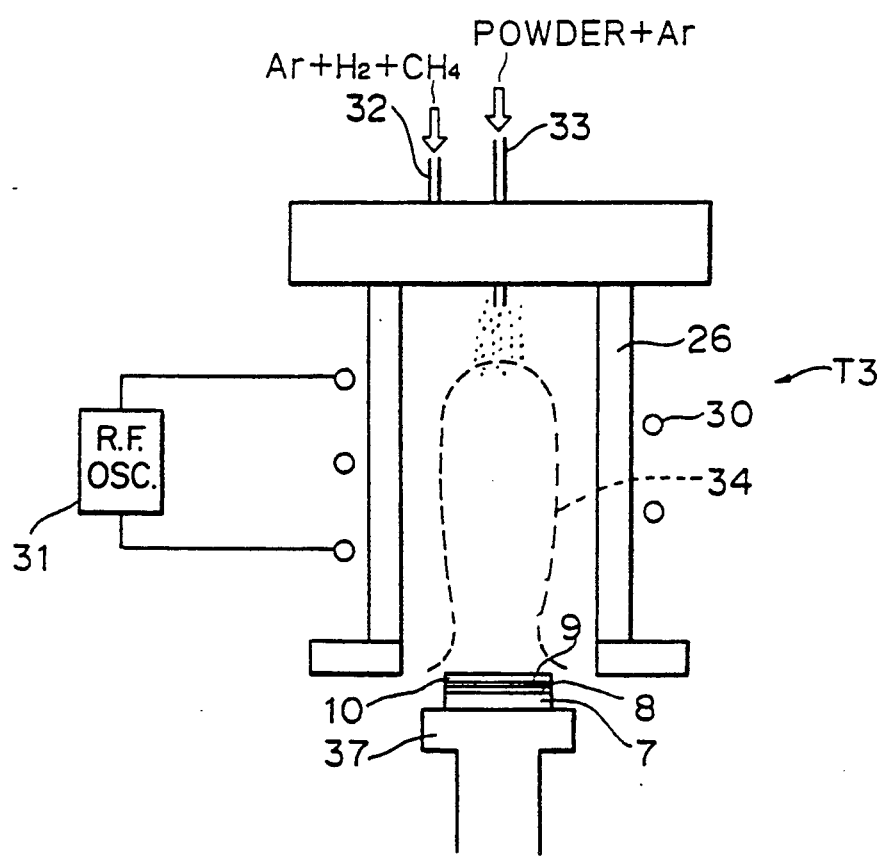
FIG. 2 is a sectional schematic view of a film forming apparatus having an RF plasma torch according to another embodiment of the present invention.

FIG. 2 is a schematic view explaining the formation of a plasma sprayed/diamond film using an RF discharge according to another embodiment of the present invention.

An RF coil 30 is wrapped around the outer circumference of an RF torch pipe 26. The RF torch pipe 26 is provided with a gas introduction port 32 for the supply of plasma gas and a gas introduction port 33 for the supply of a carrier gas carrying the plasma spraying powder. The RF coil 30 receives a supply of RF power from an RF oscillator 31, and thus a plasma 34 is formed in the RF torch pipe 26. A substrate 7 is placed on a substrate holder 37, and using the thus formed RF plasma torch T3, a plasma sprayed layer 8 is formed on top thereof, followed by a plasma sprayed/diamond mixed layer 9, a diamond layer 10, and other films.

For example, an Ar-based gas mixed with hydrogen and methane is used as the plasma gas, an Ar gas carrying the plasma spraying powder is supplied as the plasma spraying powder gas, and a plasma sprayed/diamond mixed layer is formed.

Using the production apparatus shown in FIG. 2, a plasma was formed by an RF discharge and an attempt was made to form a diamond film on an SiC substrate, with an SiC intermediate layer. The substrate was an SiC substrate of $10 \times 10 \times 3$ mm, the plasma spraying particles were SiC having an average particle size of 1 $\mu$m, the plasma spraying speed was 10 to 2 $\mu$m/min, the Ar gas flow rate was 20 liters/min., the hydrogen rate was 5 liters/min., the methane rate was 0.3 liter/min., the RF output was 20 kW, and the substrate temperature was 950° C. SiC was plasma sprayed for 10 minutes at a flame spraying speed of 20 $\mu$m/min., then the speed of supply of powder was gradually reduced, and finally, only diamond was grown, whereupon a diamond film was formed to a thickness of approximately 200 $\mu$m.

The elements of the film were analyzed by a mass spectroscope (SIMS), whereupon a minute amount of B was detected in addition to the Si, C, and H from the plasma sprayed layer 8. A small amount of Si was detected from the diamond film 10 in addition to C and H.

The same tests were performed in accordance with the prior art using a DC discharge and provided with W electrodes, whereupon a large amount of the electrode material W was detected in both the plasma sprayed film and the diamond film.

Compared with the prior art, it was found that the above embodiment enables the formation of a plasma sprayed layer and diamond layer having a higher purity.

Figure 3:
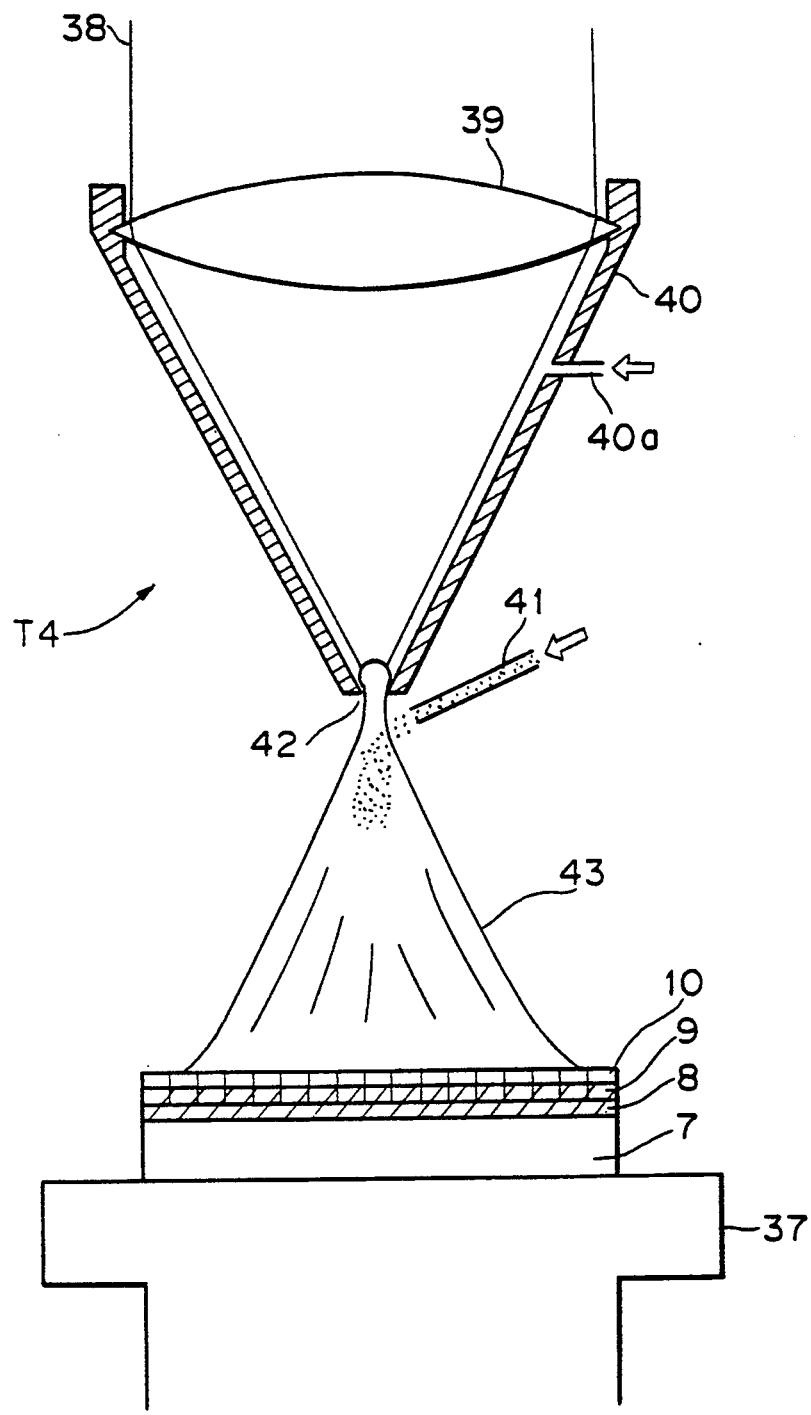
FIG. 3 is a sectional schematic view of a film forming apparatus having a laser breakdown plasma torch according to still another embodiment of the present invention.

FIG. 3 is a schematic view explaining the production of a coating film by another embodiment, using a laser breakdown.

The laser beam 38 from a large output $CO_2$ laser (not shown) is condensed by a condenser 39; further on a funnel shaped wall 40 surrounding the condensed laser beam there is provided a plasma gas supply port 40a. Further, at the edge of the constricted wall 40 is formed a nozzle 42, from which heated and expanded plasma 43 is ejected. Near the nozzle 42 is arranged a powder gas supply port 41 from which is ejected a mixture of the plasma spraying powder and carrier gas, to thereby form the torch T4.

The substrate 7 is placed on the substrate holder 37, which in turn is arranged under the nozzle 42, and a plasma sprayed/diamond mixed layer, etc., is formed on top of the substrate 7.

To the plasma gas supply port 40a there is supplied, as the plasma gas, a mixed gas of hydrogen and methane, to conduct the plasma CVD, and to the powder gas supply port 41 there is supplied an Ar gas containing the plasma spraying powder as the powder gas for the plasma spraying, to thereby form the plasma sprayed film 8, the mixed layer 9, and the diamond layer 10, etc.

Figure 4:
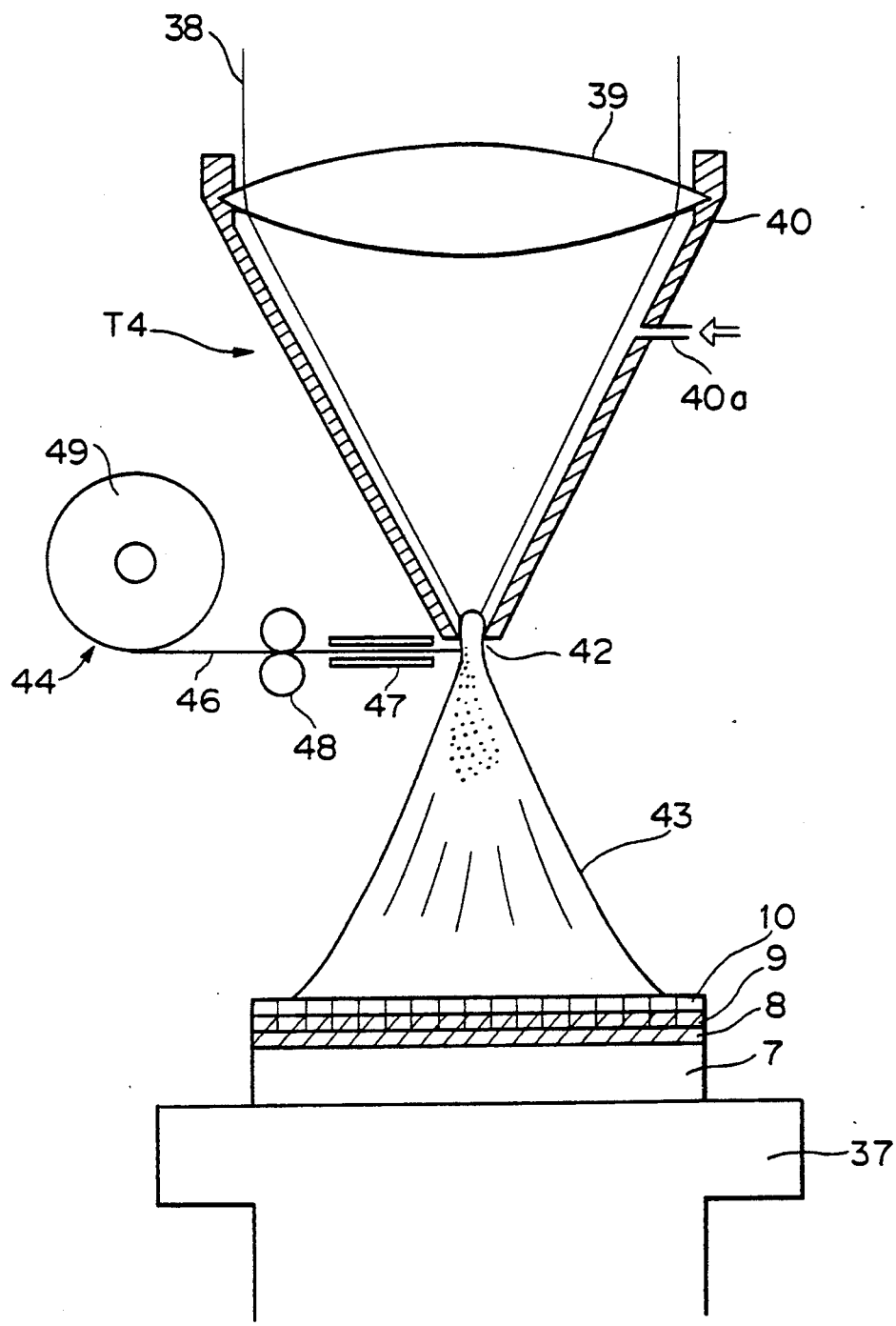
FIG. 4 is a sectional schematic view of a film forming apparatus having a laser breakdown plasma torch and a wire supply apparatus according to another embodiment of the present invention.

FIG. 4 shows the constitution, or assemblage of a combination of a laser breakdown torch T4 with a wire supply apparatus, as an apparatus for supplying the plasma spraying material.

The condenser 39, wall 40, plasma gas supply port 40a, nozzle 42, and substrate holder 37 are the same as those in FIG. 3. Underneath the nozzle 42, instead of the powder gas supply port, a wire supplying apparatus 44 is provided, i.e., the wire 46 of the plasma spraying material is wound on a wire roll 49, sent to a feed roller 48, and supplied from a wire guide 47 underneath the nozzle 42. If the diameter of the wire 46 of the plasma spraying material is made smaller and the feed speed is slowed, it is possible to reduce the speed of the supply of the plasma spraying material as desired. In this method, if the stability of the plasma gas is poor, the speed of plasma spraying finally will fluctuate, but by using a highly stable plasma gas, it is possible to conduct a stable plasma spraying. The laser breakdown process has a particularly superior plasma stability, and further, the arc can be made smaller whereby it is possible to form a plasma sprayed film with a good controllability.

An attempt was made to form a diamond film on an Mo substrate via an NbC intermediate layer, using the apparatus shown in FIG. 4.

As the laser, use was made of a gas flow type $CO_2$ laser and a laser beam 38 having an oscillation wavelength of 10.6 $\mu$m was obtained. Note, the output of the laser beam 38 was 2 kW. The Mo substrate was a plate $20 \times 20 \times 1$ mm, the plasma spraying wire was an Nb wire 0.1 mm in diameter, the gas flow rate was 10 liters/min. of hydrogen and 0.2 liter/min. of methane, and the substrate temperature was 800° C. The flame spraying speed was determined by the feed rate of the Nb wire and was 1 cm/min. The film was formed by first, continuing the plasma spraying at a wire feed rate of 20 cm/min. for 30 minutes, gradually reducing the wire feed rate over 60 minutes to zero, and then stopping the plasma spraying with the wire. Further, the diamond film was formed over 50 minutes.

After the formation of the film, a section of the sample was subjected to point analysis and line analysis by SIMS to determine the presence of introduced impurities and the state of the inclined or graded composition. As a result of the point analysis, Nb, C, and H were detected from the flame sprayed film and C and H from the diamond film, and it was found that there was no intrusion of impurities other than H.

Figure 7:
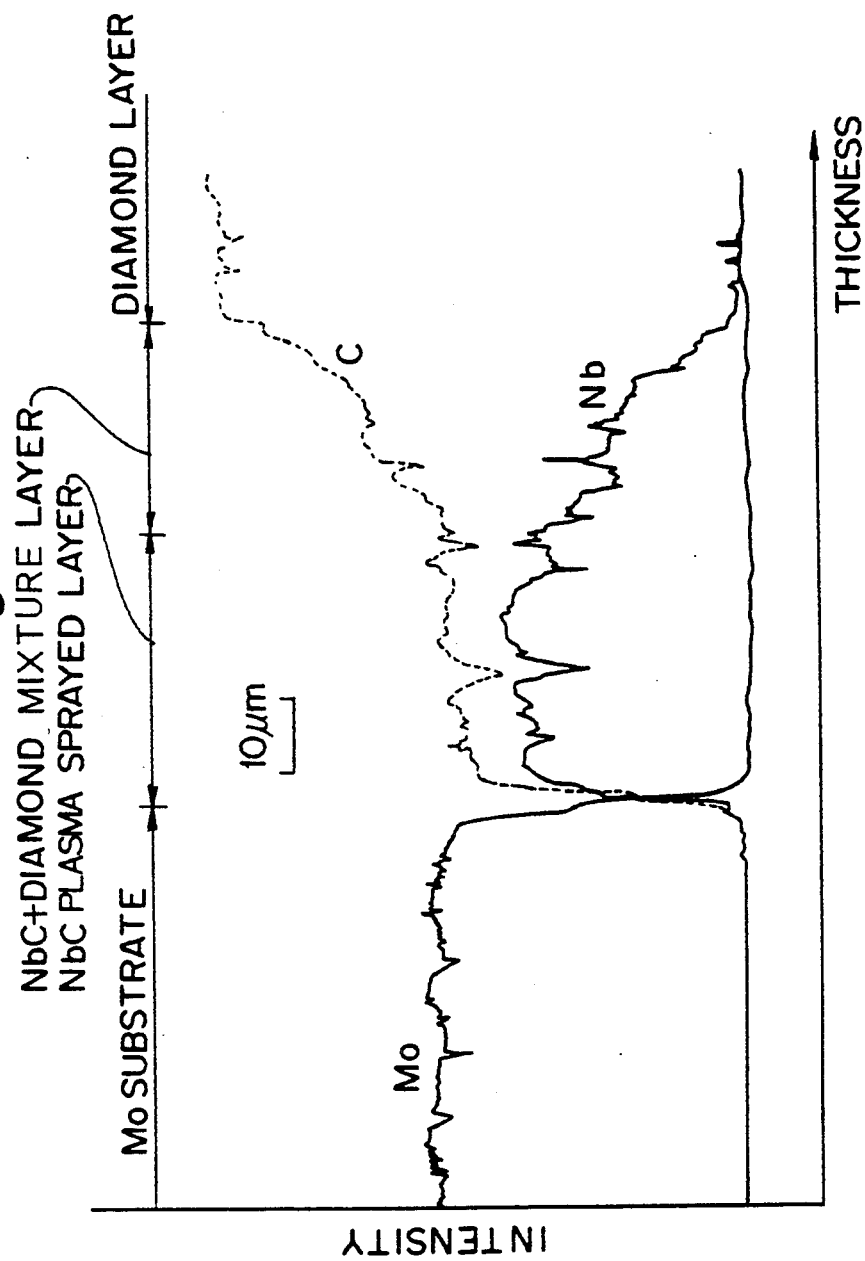
FIG. 7 is a graph showing the results of a measurement of a sample of an example of the laminated structure prepared by using the film forming apparatus of FIG. 5.

The results of the line analysis are shown in FIG. 7.

In the region of the Mo substrate, only Mo was detected, and in the region of the NbC plasma sprayed layer, certain percentages of Nb and C were detected. Preferably, in the NbC/diamond gradient composition mixed layer, the Nb is gradually reduced and the C is gradually increased, and in the diamond layer, the C is detected at a certain strength.

Figure 9:
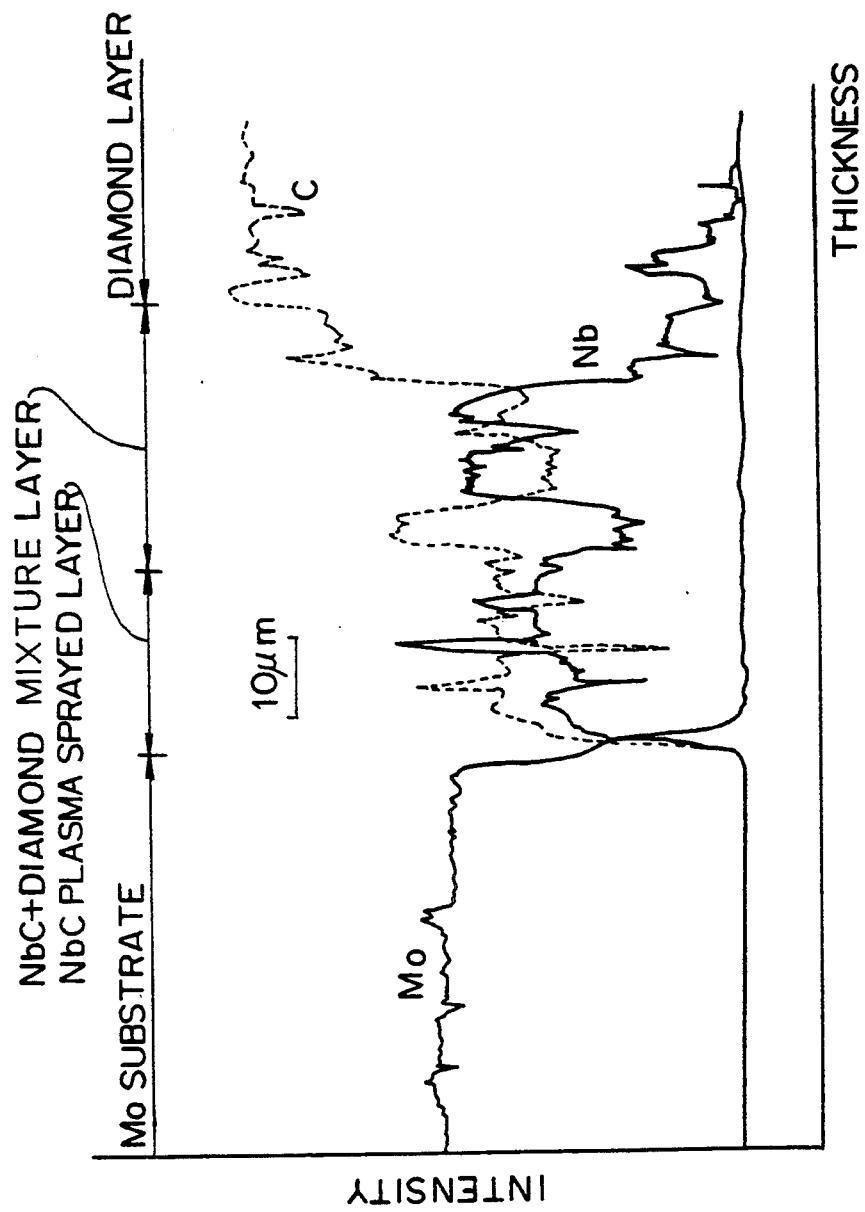
FIG. 9 is a graph showing the results of a measurement of a sample of an example of a laminated structure prepared by using the film forming apparatus of FIG. 8.

For comparison, the same constitution of a plasma sprayed/diamond film was formed by a DC discharge and powder plasma spraying technology. The results of line analysis of the sample by this comparative art are shown in FIG. 9. The desirable measurement characteristics are the same as those explained with respect to FIG. 7. A comparison of FIG. 7 and FIG. 9 shows that, in the case of the film forming method of the above-mentioned embodiment, an extremely high and thus far greater precision control of the composition is possible.

Figure 5:
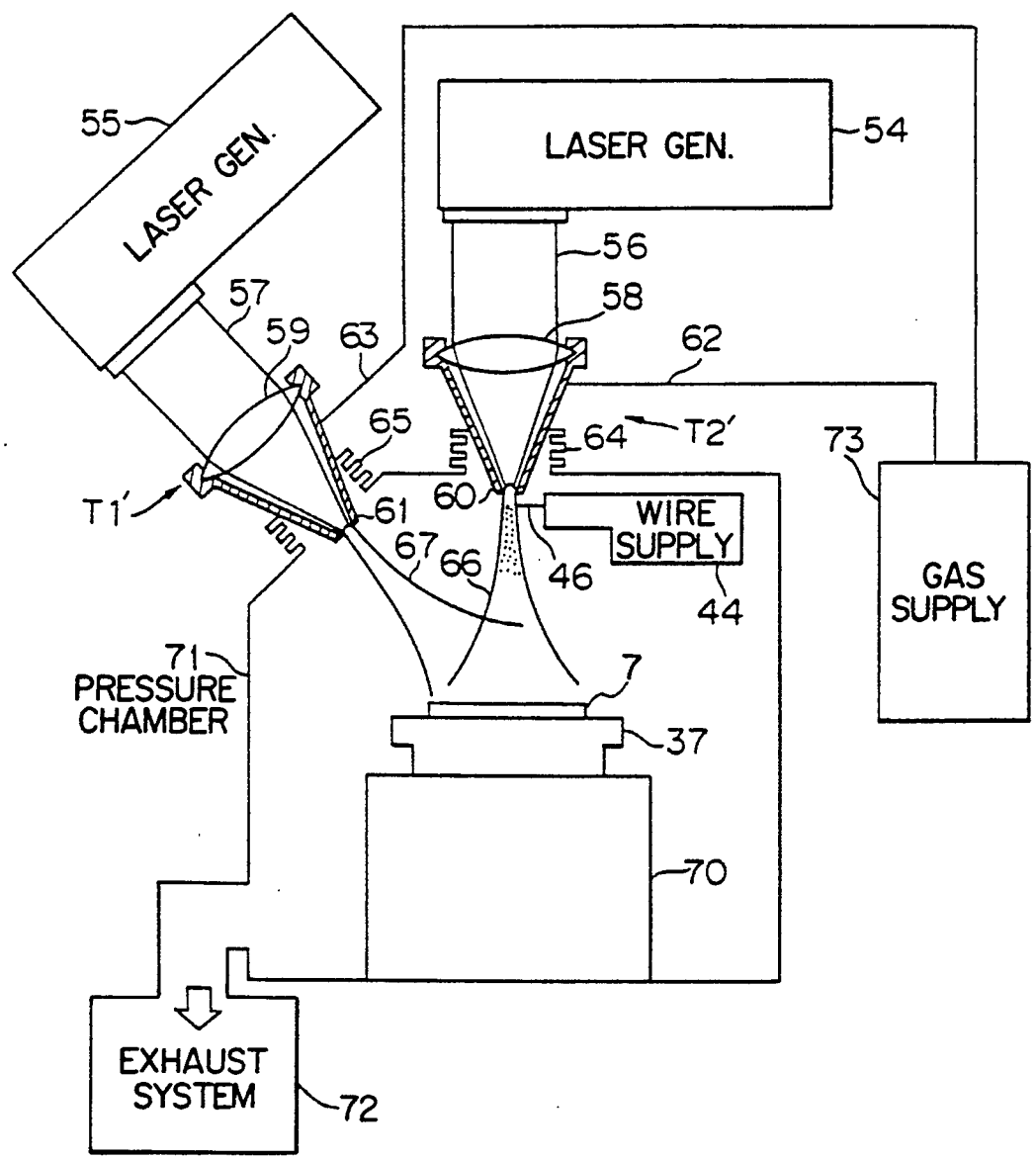
FIG. 5 is a sectional schematic view of a film forming apparatus having two laser breakdown plasma torches and a wire supply apparatus according to another embodiment of the present invention.

FIG. 5 is a schematic view of a double torch type film forming apparatus combining a laser breakdown CVD T'1 and laser breakdown wire flame spraying T'2.

The two laser generators 54 and 55 are respectively used for the plasma spraying and the CVD. The laser beams 56 and 57 emitted from the lasers 54 and 55 are condensed by the condensers 58 and 59 and shot from the nozzles 60 and 61 onto the plasma jets 66 and 67. The plasma spraying wire 46 is supplied from the wire supplying apparatus 44 underneath the plasma spraying nozzle 60. The nozzles 60 and 61 are arranged in the reduced pressure chamber 71 connected to the exhaust system 72 and a plasma sprayed film and CVD film are deposited on the substrate 7 placed on the substrate holder 37. Note, the gas supply apparatus 73 for supplying the desired gas is connected through the gas conduits 62 and 63 to the plasma spraying system T2′ and CVD system T1′.

As the laser generator, use is made of a gas flow type $CO_2$ laser and, the laser beam, a laser beam of an oscillation wavelength of 10.6 $\mu$m and an output of 2 kW is obtained. The lenses and nozzles are arranged so as to be adjustable upward and downward by the bellows 64 and 65, so that the distances from the substrate of the two plasma jets can be controlled independently.

Using the apparatus shown in FIG. 5, a diamond film was formed on an Mo substrate via an Mo plasma sprayed intermediate layer, and a test was run by plasma spraying copper thereon. The substrate was a 20×20×2 mm Mo plate, and the plasma spraying wires were Mo wire 0.1 mm in diameter and copper wire 0.1 mm in diameter. The conditions of the plasma spraying torch were a gas flow rate of 5 liters/min. Ar and a laser output of 2 kW in the case of the Mo, and 1 kW in the case of Cu. The conditions of the diamond synthesis torch were a gas flow rate of 10 liters/min. hydrogen and 0.4 liter/min. methane, a laser output of 2 kW, and a film forming speed of 3 $\mu$m/min. Further, the pressure was 100 Torr and the substrate temperature 800° C.

An Mo/diamond gradient composition layer was first formed on the substrate to a thickness of approximately 30 $\mu$m, then a diamond film was formed to approximately 200 $\mu$m. On top thereof was formed a diamond-/Cu gradient composition layer to a thickness of approximately 20 $\mu$m, and finally, Cu was plasma sprayed to a thickness of approximately 50 $\mu$m. A section of the sample prepared in this way was examined by micro X-ray diffraction and SIMS. Further, the surface of the sample was polished and a copper tensile test fitting was brazed thereto to measure the adhesion strength. As a result of the analysis of the section by micro X-ray diffraction, only a slight amount of MoC was detected from the Mo/diamond gradient composition layer, in addition to the Mo and diamond, and diamond and Cu were detected from the diamond/Cu gradient composition layer.

In the SIMS analysis, only Mo, C, Cu, and H were detected, and further, in the tensile test, the brazed portion peeled at about 1000 kg/cm$^2$.

In the case of the film structure of the same type prepared by a single DC discharge torch as in the past, it was observed from X-ray diffraction that the majority of the plasma sprayed Mo layer was MoC. Further, from SIMS analysis, the electrode material W was detected in addition to Mo, C, H, and Cu. Also, in the tensile test, the Cu and diamond peeled from each other at 300 kg/cm$^2$.

Accordingly, by using two laser breakdown torches T1′ and T2′ to conduct the diamond CVD and flame spraying, it is possible to form an extremely tough diamond film.

The diamond coating explained above may be used as a coating on, for example, tools or sliding members, or as an insulation coating for heat sinks.

The present invention was explained above in accordance with specific embodiments, but the present invention is not limited thereto. For example, as will be clear to persons skilled in the art, various changes, improvements and combinations are possible.

As explained above, according to the present invention, it is possible to prepare a plasma sprayed film and diamond film under respective suitable conditions by separating the diamond synthesis torch and the plasma spraying torch respectively employed for forming the plasma spraying film and the diamond film.

Further, by using a separate plasma spraying torch, it is possible to use an inert gas for plasma spraying, and thus to prevent hydrogen, carbon, etc. from affecting the plasma spraying particles. Therefore, it is possible to prevent spoiling of the plasma spraying material and resultant reduction of the strength.

Also, by using an RF discharge and a laser breakdown respectively to form the plasma and to form the plasma sprayed film and diamond film, it is possible to prevent an intrusion of the electrode material due to electrode wear, and thus reduce the impurities. This enables an improvement in the purity of the plasma sprayed film and diamond film.

Further, by supplying the plasma spraying material into the plasma in the form of a wire, it is possible to raise the controllability at low plasma spraying speeds and to smoothly change the gradient composition of the plasma sprayed/diamond gradient composition mixed layer. This enables an improvement of the reproducibility and reliability of the plasma sprayed/diamond gradient composition mixed layer.

We claim:

1. A process for the production of a coating film having a mixed layer of a plasma spraying material and diamond, the process using a plasma spraying first torch and a plasma CVD second torch, the first and second torches being structurally distinct and having respective, separately controlled plasma generation operating conditions, and comprising simultaneously conducting plasma spraying of the plasma spraying material using an inert gas as a plasma forming gas by the plasma spraying torch, and plasma CVD of a diamond forming material using hydrogen gas and hydrocarbon gas by the CVD plasma torch, thereby to form said mixed layer on a substrate.

2. A process for the production of a coating film as claimed in claim 1, further comprising conducting said plasma spraying by using as the plasma spraying first torch, at least one discharge torch selected from the group consisting of DC discharge, RF discharge, and laser breakdown discharge torches, thereby to generate a plasma, and conducting said plasma CVD by using as the plasma CVD second torch, at least one discharge torch selected from the group consisting of DC discharge and laser breakdown discharge torches, to thereby generate a plasma.

3. A process for the production of a coating film as claimed in claim 2, wherein said plasma spraying is conducted by using at least one member selected from the group consisting of an RF discharge and laser breakdown discharge, to thereby generate a plasma, and said plasma CVD is conducted by using a laser breakdown discharge.

4. A process for the production of a coating film as claimed in claim 1, wherein said plasma spraying is conducted while supplying a plasma spraying material in the form of a wire.

* * * * *

UNITED STATES PATENT AND TRADEMARK OFFICE
CERTIFICATE OF CORRECTION

PATENT NO. : 5,314,726  
DATED : May 24, 1994  
INVENTOR(S) : KAZUAKI KURIHARA et al.

It is certified that error appears in the above-indentified patent and that said Letters Patent is hereby corrected as shown below:

On title page, item [54] and col. 1, line 1, after "Process" insert --And Apparatus-- and delete "Forming A Mixed Layer Of A Plasma Sprayed Material and Diamond" and substitute --Production Of Coating Film--.

Abstract, line 6, delete second occurrence of "a".

Column 3, line 7, delete "a";

line 62, delete "a" and substitute --the--.

Column 5, line 49 after "Ti/" delete "-".

Column 6, line 8, delete new paragraph;

line 10, delete new paragraph.

Column 7, line 12, after "sprayed/" delete "-";

UNITED STATES PATENT AND TRADEMARK OFFICE
CERTIFICATE OF CORRECTION

PATENT NO. : 5,314,726
DATED : May 24, 1994
INVENTOR(S) : Kazuaki Kurihara et al.

It is certified that error appears in the above-indentified patent and that said Letters Patent is hereby corrected as shown below:

Column 7, line 67, after "assemblage" insert --,--.

Signed and Sealed this

Sixth Day of September, 1994

Attest:

Attesting Officer

BRUCE LEHMAN

Commissioner of Patents and Trademarks